(12) United States Patent
Kabir

(10) Patent No.: US 9,206,532 B2
(45) Date of Patent: Dec. 8, 2015

(54) NANOSTRUCTURE DEVICE AND METHOD FOR MANUFACTURING NANOSTRUCTURES

(75) Inventor: Mohammad Shafiqul Kabir, Gothenburg (SE)

(73) Assignee: Smoltek AB, Göteborg (SE)

( * ) Notice: Subject to any disclaimer, the term of this patent is extended or adjusted under 35 U.S.C. 154(b) by 46 days.

(21) Appl. No.: 13/879,617

(22) PCT Filed: Oct. 18, 2010

(86) PCT No.: PCT/EP2010/065654
§ 371 (c)(1),
(2), (4) Date: May 20, 2013

(87) PCT Pub. No.: WO2012/052051
PCT Pub. Date: Apr. 26, 2012

(65) Prior Publication Data
US 2013/0230736 A1     Sep. 5, 2013

(51) Int. Cl.
*C01B 31/02* (2006.01)
*D01F 9/127* (2006.01)
(Continued)

(52) U.S. Cl.
CPC ............... *D01F 9/127* (2013.01); *B05D 3/107* (2013.01); *B82Y 10/00* (2013.01); *B82Y 30/00* (2013.01); *B82Y 40/00* (2013.01); *C01B 31/0226* (2013.01); *C01B 31/0233* (2013.01); *C01B 31/0293* (2013.01); *C23C 16/44* (2013.01); *H01L 29/0676* (2013.01); *H01L 29/1606* (2013.01); *H01L 29/413* (2013.01); *H01L 29/775* (2013.01); *H01L 29/2003* (2013.01); *Y10T 428/12396* (2015.01)

(58) Field of Classification Search
USPC ..................... 977/700; 427/249.1; 428/408
See application file for complete search history.

(56) References Cited

U.S. PATENT DOCUMENTS 6,855,376 B2 * 2/2005 Hwang et al. ............... 204/192.1
7,582,507 B2 * 9/2009 Hongo ........................... 977/742
(Continued)

FOREIGN PATENT DOCUMENTS

CN    101097826    1/2008
JP    2004026532 A    1/2004
(Continued)

OTHER PUBLICATIONS

International Search Report issued in PCT/EP2010/065654 on Aug. 9, 2011, 3 pages.
(Continued)

*Primary Examiner* — Archene Turner
(74) *Attorney, Agent, or Firm* — Fish & Richardson P.C.

(57) ABSTRACT

A method for manufacturing a plurality of nanostructures (101) on a substrate (102). The method comprises the steps of: depositing a bottom layer (103) on an upper surface of the substrate (102), the bottom layer (103) comprising grains having a first average grain size; depositing a catalyst layer (104) on an upper surface of the bottom layer (103), the catalyst layer (104) comprising grains having a second average grain size different from the first average grain size, thereby forming a stack of layers comprising the bottom layer (103) and the catalyst layer (104); heating the stack of layers to a temperature where nanostructures (101) can form; and providing a gas comprising a reactant such that the reactant comes into contact with the catalyst layer (104).

15 Claims, 4 Drawing Sheets

(51) Int. Cl.
*B82Y 10/00* (2011.01)
*B82Y 30/00* (2011.01)
*B82Y 40/00* (2011.01)
*H01L 29/06* (2006.01)
*H01L 29/16* (2006.01)
*H01L 29/41* (2006.01)
*H01L 29/775* (2006.01)
*B05D 3/10* (2006.01)
*C23C 16/44* (2006.01)
*H01L 29/20* (2006.01)

(56) References Cited

U.S. PATENT DOCUMENTS

| | | | | |
|---|---|---|---|---|
| 7,682,973 B2 * | 3/2010 | Kim et al. | | 438/680 |
| 7,687,876 B2 * | 3/2010 | Kabir | | 257/471 |
| 7,838,165 B2 * | 11/2010 | Suenaga et al. | | 423/447.3 |
| 8,574,679 B2 * | 11/2013 | Kawabata | | 427/301 |
| 2006/0002844 A1 | 1/2006 | Suenaga et al. | | |
| 2006/0078680 A1 | 4/2006 | Nakano | | |
| 2006/0141153 A1 * | 6/2006 | Kubota et al. | | 427/249.1 |
| 2008/0003733 A1 | 1/2008 | Kim et al. | | |
| 2008/0241493 A1 | 10/2008 | Kawabata | | |
| 2009/0121219 A1 | 5/2009 | Song et al. | | |
| 2010/0117764 A1 * | 5/2010 | Wang et al. | | 427/249.4 |

FOREIGN PATENT DOCUMENTS

| | | | |
|---|---|---|---|
| JP | 2005350342 A | 12/2005 | |
| JP | 2006255817 A | 9/2006 | |
| JP | 2006342040 A | 12/2006 | |
| JP | 2008251708 A | 10/2008 | |
| JP | 2009536912 T | 10/2009 | |
| WO | WO2004000728 A1 | 12/2003 | |
| WO | WO2006115453 A1 | 11/2006 | |
| WO | WO2008060665 A3 | 2/2009 | |

OTHER PUBLICATIONS

Database WPI, Week 200711, Thomson Scientific, London, GB; AN 2007-106324, XP000002641327, & JP 2006 342040 A (UNIV Kumamoto) Dec. 21, 2006, Abstract, 3 pages.

Japanese Office Action issued in JP 2013-533099 on Apr. 8, 2014, with English Translation, 13 pages.

European Office Action issued in EP10768764.2 on Jul. 22, 2014, 4 pages.

Chinese Office Action issued in CN201080069525.0 on Feb. 7, 2014 with English Translation, 8 pages.

* cited by examiner

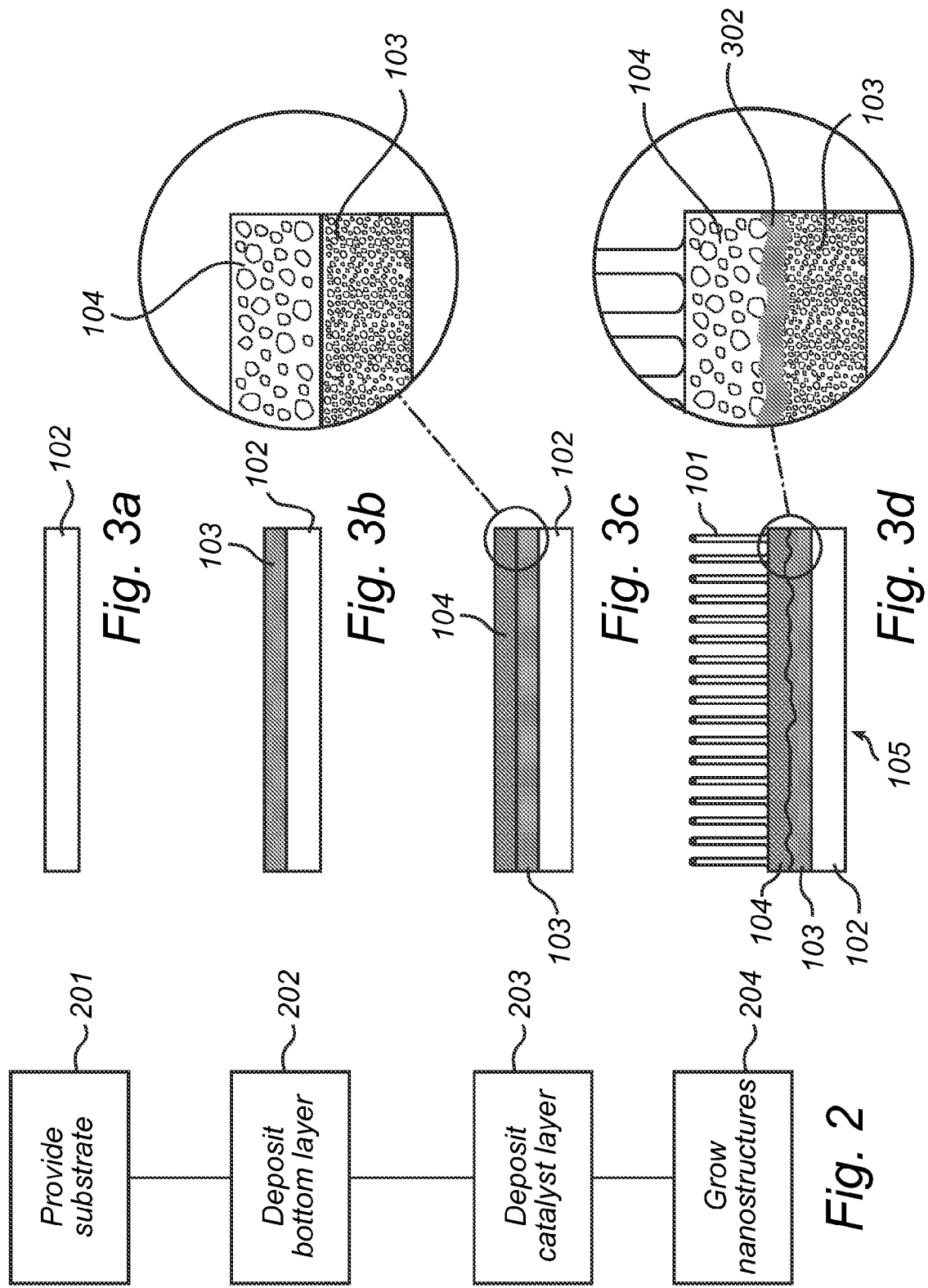

NANOSTRUCTURE DEVICE AND METHOD FOR MANUFACTURING NANOSTRUCTURES

CROSS-REFERENCE TO RELATED APPLICATIONS

This application is a U.S. National Phase Application of International Patent Application No. PCT/EP2010/065654 filed Oct. 18, 2010.

FIELD OF THE INVENTION

The present invention relates to a method of manufacturing nanostructures, and to a nanostructure device.

TECHNICAL BACKGROUND

As the scaling of semiconductor devices continues into the nanometer regime there is an ever increasing search for new and improved nanostructures for replacing conventional devices and technologies. Many methods of fabricating nanostructures are known in the literature.

For example, U.S. Pat. No. 7,687,876 discloses a method for fabricating nanostructures where several intermediate layers are deposited on a substrate followed by a catalyst layer from which nanostructures are grown. Through the provision of a multi-layer stack between the substrate and the catalyst layer, the morphology as well as the electrical properties of the nanostructures can be tailored to a wide variety of applications. For certain applications, where such an extensive tailoring capability may not be required, it would be desirable to reduce the number of process steps involved in forming the nanostructures.

SUMMARY OF THE INVENTION

In view of the above, it is an object of the present invention to provide an improved method for fabrication of nanostructures, and in particular a method for fabrication of nanostructures enabling cost reduction through reduced manufacturing complexity.

According to a first aspect of the present invention, it is therefore provided a method for manufacturing a plurality of nanostructures on a substrate, the method comprising: depositing a bottom layer on an upper surface of the substrate, the bottom layer comprising grains having a first average grain size; depositing a catalyst layer on an upper surface of the bottom layer, the catalyst layer comprising grains having a second average grain size different from the first average grain size, thereby forming a stack of layers comprising the bottom layer and the catalyst layer; heating the stack of layers to a temperature where nanostructures can form and providing a gas comprising a reactant such that the reactant comes into contact with the catalyst layer.

The present invention is based on the realization that nanostructure growth can be promoted in a configuration with as few as two layers provided on a substrate by properly selecting the relation between the grain sizes of the layers provided on the substrate.

Two layers with different average grain size will give different mechanical properties of the layers, more specifically, the difference in average grain size will have an effect on the stress properties of the layers. The stress in a layer may in turn influence crystallographic properties and morphology. Here, the surface of the catalyst layer is altered in such a way that the surface properties of the catalyst layer promote nanostructure growth. Furthermore, a difference in grain size will enable interdiffusion between two adjacent layers. As interdiffusion may alter the crystallographic properties of the interdiffused layers, it may also lead to a change of stress in the layers thereby modifying crystallographic and morphological properties of the surface of the catalyst layer through recrystallization. The growth of nanostructures is influenced by both the crystallographic structure and morphology of the surface of the material from which they grow. Thus, by providing a bottom layer and a catalyst layer with different average grain sizes, conditions promoting growth of nanostructures using as few as two layers can be obtained, thereby achieving reduced manufacturing cost and process complexity.

The substrate may be made of any of a wide range of materials. Most commonly used are semiconductor-based materials such as silicon, silicon oxide, silicon nitride, silicon carbide, silicides, AlGaAs, AlGaN or SiGe but also other materials such as optically transparent substrates (ITO, quartz, glass, sapphire, diamond), polymers (polyimide, epoxies, PDMS, SU8, SAL6001) or any metals, metal alloys or insulators are possible.

As a bottom layer it is possible to use a wide range of insulating, semiconducting or conducting materials, and as a catalyst layer one may advantageously use metals or metal alloys such as Fe, Ni, NiCr, Au, Cu, Pt, Pd or Co. Additionally, it is also possible to use Co-based bimetals as a catalyst, examples of such bimetals are Co—V, Co—Fe, Co—Ni, Co—Pt, Co—Y, Co—Cu and Co—Sn.

Several different deposition methods are available for depositing the thin films of insulating, semiconducting or conducting materials used in the bottom and catalyst layers. Among the most common deposition methods are sputtering and different evaporation methods such as electron beam evaporation, thermal evaporation or resistive evaporation, but it is also possible to use other methods such as chemical vapor deposition (CVD) or electroplating, as long as such methods are tuned such that the desired different average grain sizes are achieved.

Henceforth, when discussing grain size it is always with reference to an average grain size. The average grain size can be measured using several different methods. One simple approach is to count the number of grains in a given area in a plane at the upper surface of a material or in a cross section, thereby calculating an average intersected grain area defining the average grain size. Measuring the grain size area according to that method can advantageously be done by atomic force microscopy (AFM) or transmission electron microscopy (TEM).

In the context of the present application, the catalyst layer is a layer comprising a material or combination of materials acting as a catalyst in a catalytic process, wherein a chemical reaction between the catalyst and at least one reactant species takes place, leading to growth of nanostructures from the catalytic layer. A typical reaction in a catalytic process is the decomposition of organic compounds. In such a process the catalyst reacts with the organic compound, usually forming intermediate species that subsequently give the final reaction product from which the nanostructures are formed. The reactant may advantageously be provided in the form of a vapor, gas or as a component in a carrier gas. Growth of nanostructures may advantageously be performed by CVD methods such as Remote Plasma-Enhanced CVD (RPECVD), thermal CVD, Metal-Organic CVD (MOCVD), Plasma Enhanced CVD (PECVD), Microwave CVD, Inductively Coupled Plasma CVD (ICPCVD) or any other types of CVD known in the art.

In one embodiment of the present invention, the largest of the first average grain size and the second average grain size may be at least 10% larger than the smallest of the first average grain size and the second average grain size. Furthermore, in one embodiment of the invention, the first average grain size (of the bottom layer) may be smaller than the second average grain size (of the catalyst layer). Additionally, the bottom layer and the catalyst layer may advantageously have different material compositions.

As the diffusion at the interface between the bottom layer and the catalyst layer predominantly takes place along and around grain boundaries, having a smaller grain size in the bottom layer improves control of the diffusion process, thereby enabling better control of the crystallographic properties and morphology of the catalyst layer surface to promote nanostructure growth. For that reason, controlled diffusion by controlling the grain size of the different layers provides a greater degree of control of the catalyst layer.

Additionally, impurity elements may advantageously be introduced into at least one of the bottom layer and the catalyst layer during deposition of the layer(s), after deposition of one or both layers, or during nanostructure growth. Impurity elements may be introduced in gas phase, as reactive radicals, as ions, or in the form of vapor. Methods for introducing impurity elements may, for example, include annealing in an ambient gas containing impurity elements, and ion bombardment. Examples of such impurity elements include H, N, O, $CO_2$, Ar, $H_2O$ vapor or combinations thereof. Impurity elements introduced during deposition of materials may change the growth kinetics of thin films which can result in additional stress, or impurities may change the grain size distributions in the deposited films, thereby affecting diffusion properties. Furthermore, introduction of impurity elements may also change the crystallographic structure of the material into which they are introduced, thus providing additional possibilities to tailor the grain size and diffusion properties.

There are several ways to control the relationship between the average grain size of the bottom layer and the average grain size of the catalyst layer. In general, a material deposited by sputtering will have a smaller grain size than a material deposited by evaporation. Therefore it may be advantageous to deposit one layer by sputtering and the other layer by evaporation to achieve a difference in grain size. As an example, different deposition methods may be used for forming the bottom layer and the catalyst layer to achieve different grain sizes.

In one embodiment of the present invention, the catalyst layer may be patterned prior to nanostructure growth, providing the option to only grow nanostructures in desired pre-defined positions.

According to a second aspect of the present invention, there is provided a nanostructure device, comprising: a substrate, a bottom layer arranged on an upper surface of the substrate, the bottom layer comprising grains having a first average grain size; a catalyst layer arranged on an upper surface of the bottom layer, the catalyst layer comprising grains having a second average grain size, different from the first average grain size of the bottom layer, thereby forming a stack of layers; a plurality of nanostructures disposed on the catalyst layer wherein each of the nanostructures comprises: a base adjacent to the catalyst layer; a tip; and a body between the base and the tip.

Effects and features of this second aspect of the present invention are largely analogous to those described above in connection with the first aspect of the present invention.

In one embodiment of the present invention, an interdiffused region where the two layers are mixed is present at the interface between the bottom layer and the catalyst layer. The interdiffused region can be distinguished by using measurement methods such as AFM or TEM or chemical analysis such as EDX or XPS.

According to one embodiment of the present invention, the layer having a smaller grain size may advantageously be made of a first material selected from a group of materials having a relatively high melting point and the layer having a larger grain size may advantageously be made of a second material, different from the first material, selected from a group of materials having a relatively low melting point, lower than the melting point of the first material. In general, layers formed from materials with lower melting points exhibit a larger average grain size than layers formed from materials with higher melting points. A material with a high melting point may advantageously be selected from the group of W, Mo or Ta and a material with a low melting point may be selected from the group of Fe, Ni, Au, Cu, Pt, Pd and Co.

In one embodiment of the present invention, the nanostructures may advantageously comprise carbon and can for example be, carbon nanotubes or carbon nanofibers. Furthermore, a nanostructure may comprise a graphene layer.

It would also be possible to use the method of the present invention to fabricate nanostructure devices comprising nanostructures formed by semiconductor materials and/or metals such as InP, GaAs, InGaAs, GaN, SiC, Si, CdS, ZnO, $TiO_2$, Ni, Al, Au, Ag, W, Cu, Pd, Pt, Mo or combinations thereof.

BRIEF DESCRIPTION OF THE DRAWINGS

These and other aspects of the present invention will now be described in more detail with reference to the appended drawings showing a currently preferred embodiment of the invention, wherein:

FIG. 2 is a flow-chart schematically illustrating a manufacturing method according to various embodiments of the present invention;

FIGS. 3a-d schematically illustrate the fabrication steps for making a nanostructure device;

DETAILED DESCRIPTION OF AN EMBODIMENT OF THE INVENTION

In the present detailed description, various embodiments of the method for manufacturing nanostructures according to the present invention are mainly discussed with reference to methods promoting controlled growth of nanostructures such as nanowires or nanofibres. Furthermore, the bottom layer and the catalyst layer are deposited using different deposition methods.

This should by no means be construed as limiting the scope of the present invention, which, for example, also encompasses methods and nanostructure devices where the nanostructures are made of other materials than carbon, and/or where the bottom layer and the catalyst layer are deposited using the same method.

Figure 1:
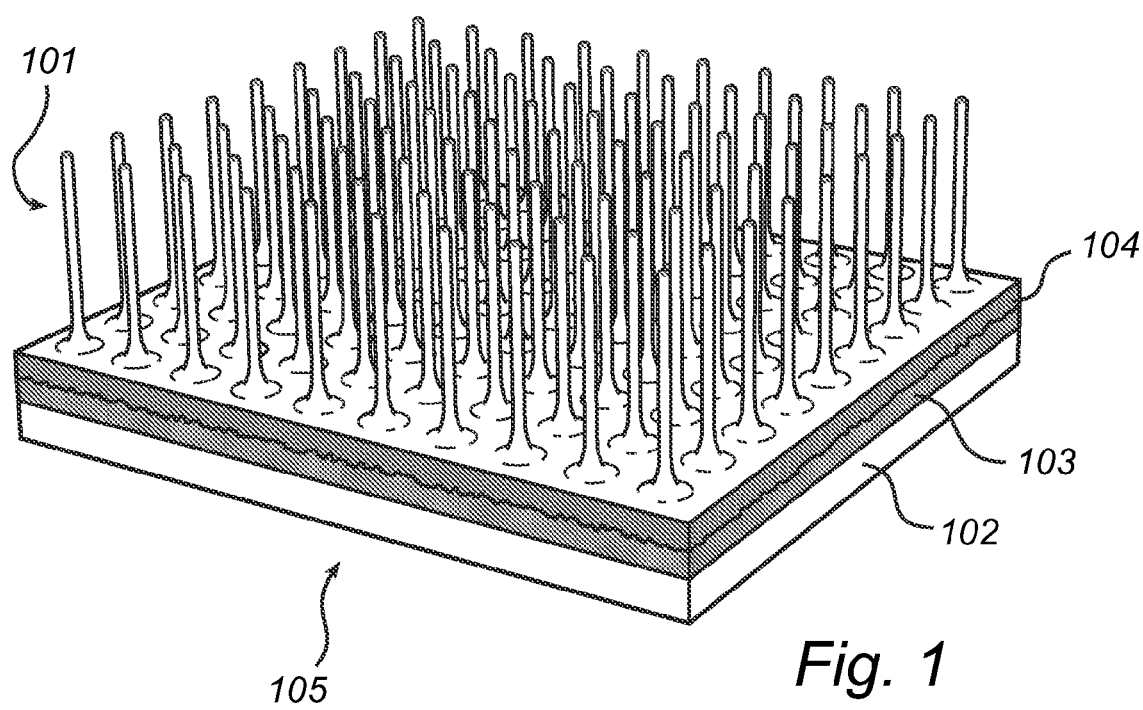
FIG. 1 schematically illustrates a nanostructure device according to an embodiment of the present invention.

FIG. 1 schematically illustrates a nanostructure device 105 according to an embodiment of the present invention. Furthermore, FIG. 1 shows the bottom layer 103 arranged on an upper surface of the substrate 102 and the catalyst layer 104 arranged on an upper surface of the bottom layer 103.

A method according to various embodiments of the present invention will now be described with reference to the flowchart shown in FIG. 2 outlining the general method steps for fabrication of nanostructures together with FIGS. 3a-d illustrating the nanostructure device in different stages of the manufacturing process.

In a first step 201, a suitable substrate 102 is provided as shown in FIG. 3a. The substrate 102 can be of any insulating, semiconducting or conducting substrate, such as a silicon wafer of standard type.

In the next step 202, a conducting bottom layer 103 comprising a metal or metal alloy is deposited on the surface of the substrate 102 as illustrated in FIG. 3b. The grain size of the bottom layer 103 is controlled through the choice of material and/or deposition method so as to produce a bottom layer having the desired average grain size. A bottom layer 103 having a relatively small grain size is achieved by using a material having a higher melting point and/or by depositing the material by sputtering.

Following the deposition of the bottom layer 103, the next step 203 is the deposition of a metallic catalyst layer 104 on top of the bottom layer 103, thereby forming a stack of layers as shown in FIG. 3c. In order to achieve a difference in grain size between the bottom layer 103 and the catalyst layer 104, the process parameters governing the grain size of the catalyst layer 104 are determined with respect to the grain size of the bottom layer 103. A catalyst layer 104 having a larger grain size than the bottom layer 103 can be achieved by selecting a material with a lower melting point and/or depositing the material by evaporation. In FIG. 3c it is more clearly illustrated that the grain size of the bottom layer 103 is smaller than the grain size of the catalyst layer 104.

The following step 204 comprises growth of the nanostructures 101. The growth process starts by heating the stack of layers in a step where the temperature is ramped up to a temperature suitable for nanostructure growth. As the stack of layers is heated, the bottom layer 103 and catalyst layer 104 interdiffuse at the interface between the two layers. The extension of the resulting interdiffused region 302 depends on material properties, temperature and time of exposure to an elevated temperature.

Additionally, it is also possible to alter the diffusion properties by introducing impurity elements into one or both of the layers. Impurities introduced during deposition of the layers may change the growth properties of the layers, thereby influencing stress properties and the resulting crystallographic structure. Impurities introduced during deposition may also alter the grain size as a result of dangling bonds and/or other defects. Alternatively, or in combination, impurities can be introduced by ion bombardment or annealing after the layers are grown, also altering the crystallographic properties of the surface so as to promote nanostructure growth.

When the sample is heated to the preferred temperature, a gas or vapor is provided containing the reactant species, which through a reaction with the catalytic layer 104 forms the nanostructures 101. Shown in FIG. 3d is a nanostructure device 105 with a plurality of grown nanostructures 101. FIG. 3d also illustrates the interdiffused region 302 between the bottom layer 103 and the catalyst layer 104 as a region where the materials have merged and formed an alloy where distinctive grains no longer are discernible. However, atomic concentrations of both materials can be found in the interdiffused region 302 by using analysis methods such as energy-dispersive X-ray spectroscopy (EDX) or TEM.

The catalyst layer 104 may be patterned prior to nanostructure growth in order to manufacture nanostructures only in predefined locations. Alternatively, on a non-patterned surface, nanostructures grow from nucleation sites over the entire surface of the catalyst layer.

Figure 4:
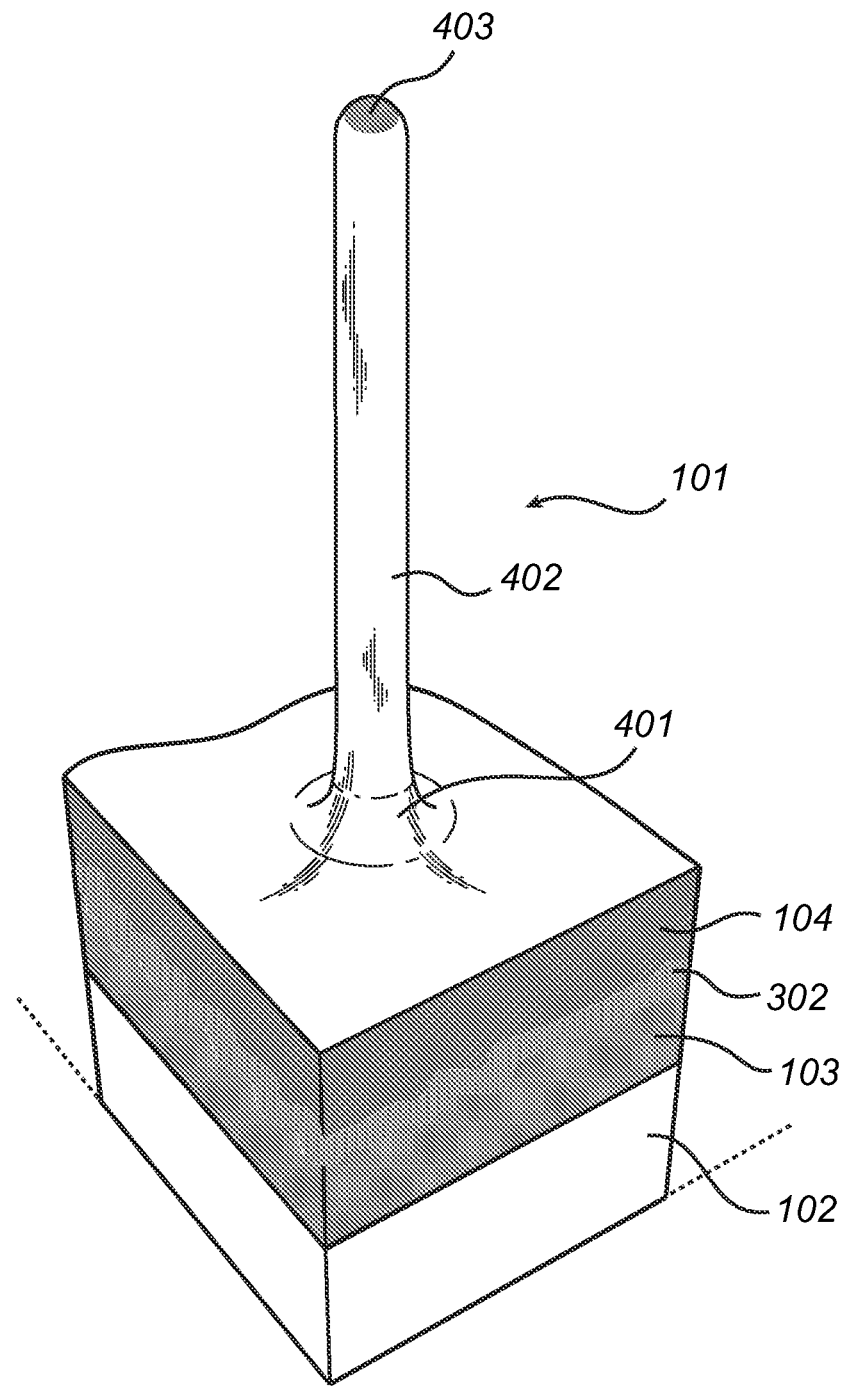
FIG. 4 schematically illustrates a single nanostructure from the nanostructure device in FIG. 1.

FIG. 4 shows a schematic example of a single nanostructure 101. Each nanostructure 101 has a base 401 adjacent to the catalyst layer 104, a tip 403 and a body 402 between the base 401 and the tip 403. Due to the growth mechanisms of nanostructures, and of nanowires in particular, the tip 403 of the nanowires will have a cap-like formation as shown in FIG. 4 containing material from the catalyst layer 104. Depending on the extension of the interdiffused region 302 between the two layers, there may also be traces of the bottom layer material 103 found in the tip 403 of the nanostructures 101.

EXAMPLES

The following examples are presented to further illustrate the invention and are not to be construed as unduly limiting the scope of this invention.

Figures 5, 6:
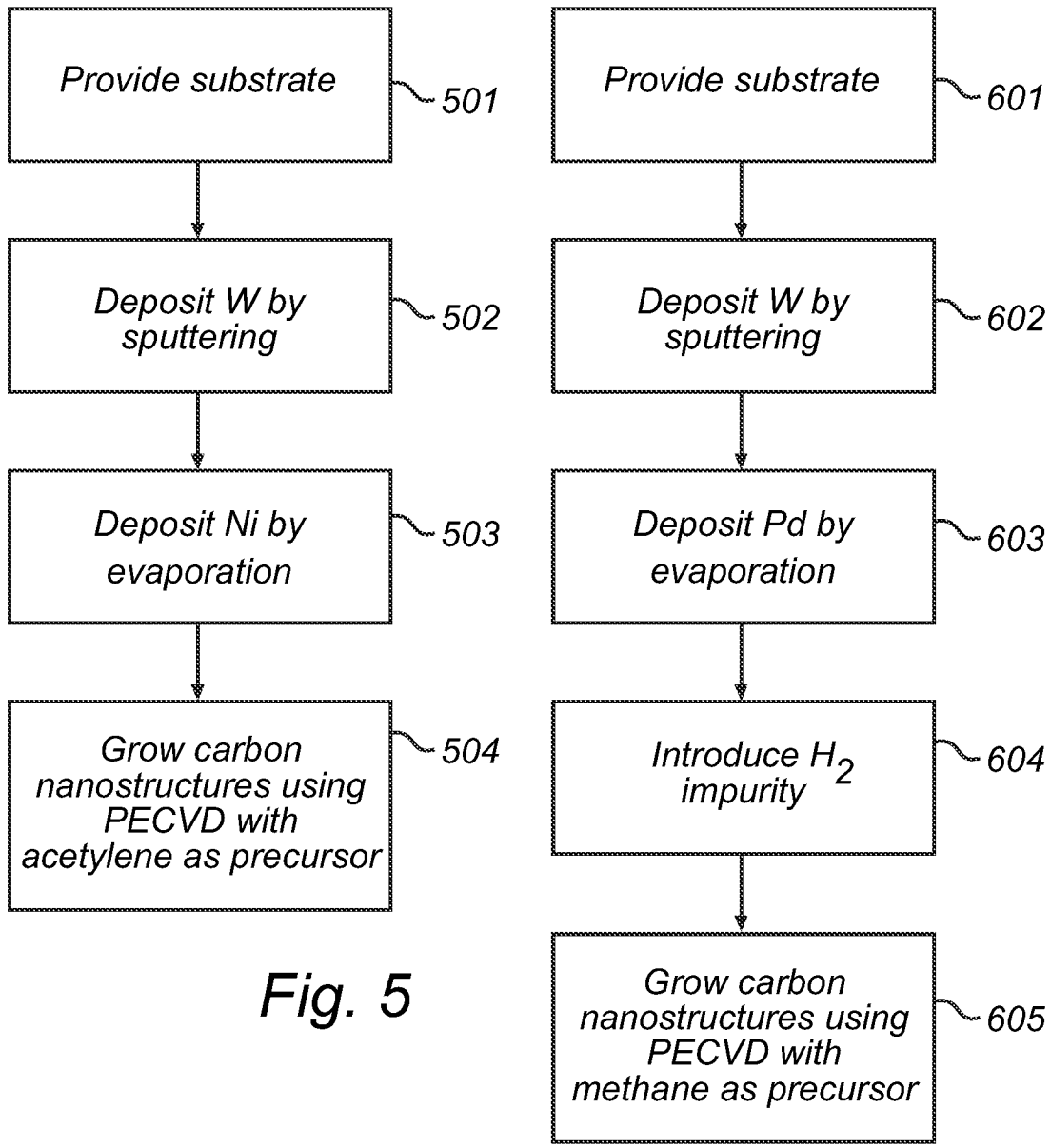
FIG. 5 is a flow-chart schematically illustrating an embodiment of the method according to the present invention.
FIG. 6 is a flow-chart schematically illustrating another embodiment of the method according to the present invention.

In a first example embodiment of the present invention illustrated by the flow chart in FIG. 5, the first step 501 is to provide a substrate followed by the step 502 of depositing a bottom layer comprising W deposited by sputtering. Next, in step 503, a catalyst layer comprising Ni is deposited by evaporation. In the final step 504, carbon nanostructures are grown by PECVD using acetylene as a carbon carrying precursor.

In a second example embodiment of the present invention illustrated by the flow chart in FIG. 6, the first step 601 is to provide a substrate followed by the step 602 of depositing a bottom layer comprising W deposited by sputtering. Next, in step 603, a catalyst layer comprising Pd is deposited by evaporation. In the next step 604, an impurity species in the form of $H_2$ is introduced into the fabrication process during temperature ramping stage prior to nanostructure growth. In the final step 605, carbon nanostructures are grown by PECVD. In this embodiment, methane is used as a carbon carrying precursor.

EXAMPLES OF APPLICATIONS

A possible application for the technology according to the present invention is for making interconnects in integrated circuits. Interconnects can be manufactured by first depositing a conductive bottom layer on the surface of a substrate where the bottom layer has a relatively small grain size. Next, a catalyst layer having a larger grain size is deposited, followed by growth of conductive nanostructures. The grown nanostructures are then covered by an insulating layer which is followed by an etching step to uncover the tip of the nanostructure. The exposed tip of the nanostructure is contacted by a conductive material to form the top contacts of an interconnect device.

Another application of nanostructures fabricated according to the present invention is for use in bump bonding where two conductive layers can be connected using a nanostructure assembly. The fabrication method is largely analogous to the method for fabricating interconnects. However, after exposing the nanostructure tips, the chip containing the device is flipped and contacted to a conductive surface on a second chip (flip chip bonding), thereby creating a connection between two conducting layers. Additionally, the surface exposing the nanostructure tips may be polished to achieve a uniform length of the nanostructures.

Using the bonding technology described above, it is also possible to use nanostructure devices as anisotropic conducting films (ACF). Yet another application is to use two devices as described above with exposed nanostructure tips to achieve Velcro bonding. This is done by pressing the two surfaces containing exposed tips against each other, thereby creating a bond between the two surfaces.

The methods described herein are applicable in general controlled growth of nanostrucutures. The methods may also be used in any assembly techniques for electronic components that include analog and/or digital electronic circuits. For example, such components may be found in:

communications engineering, car/industrial electronics goods, consumer electronics, computing, digital signal processing and integrated products. Attaching technologies such as ball grid array (BGA), flip chip (FC) modules, CSP, WLP, FCOB, TCB, TSV 3D stacking, metallization schemes may utilize the methods herein. Integrated Circuit (IC) types such as RFID, CMOS, BiCMOS, GaAS, AlGAAs, MMIC, MCM, may utilize the methods described herein. Display technologies such as LCD's, LED's, and OLED's, as used in automobiles, computers, mobile phone handsets, and televisions may also incorporate nanostructures and connection techniques made by the methods described herein. Other electronic components that may similarly incorporate such technology include, but are not limited to: ASIC chips, memory devices, MCU, high frequency device modules, integrated passive components such as resistor, capacitors, inductors etc.

The invention claimed is:

1. A method for manufacturing a plurality of nanostructures on a substrate, the method comprising the steps of:
    depositing a bottom layer on an upper surface of the substrate using a first deposition method tuned to achieve a first crystallographic grain structure having a first average grain size;
    depositing a catalyst layer on an upper surface of the bottom layer using a second deposition method tuned to achieve a second crystallographic grain structure having a second average grain size larger than said first average grain size, thereby forming a stack of layers comprising said bottom layer and said catalyst layer;
    heating the stack of layers to a temperature that is sufficient for nanostructure growth and that results in interdiffusion between the bottom layer having the first average grain size and the catalyst layer having the second average grain size; and
    providing a gas comprising a reactant such that the reactant comes into contact with the catalyst layer.

2. The method according to claim 1, wherein the second average grain size is at least 10% larger than the first average grain size.

3. The method according to claim 1, wherein the catalyst layer has a first material composition and the bottom layer has a second material composition that is different from said first material composition.

4. The method according to claim 3, further comprising the step of:
    introducing at least one impurity element into at least one of the bottom layer and the catalyst layer during deposition of said layers.

5. The method according to claim 3, further comprising the step of:
    introducing at least one impurity element into at least one of the bottom layer and catalyst layer after deposition of said layers.

6. The method according to claim 1, further comprising the step of:
    patterning said catalyst layer prior to nanostructure growth.

7. The method according to claim 1, wherein said bottom layer is deposited by sputtering.

8. The method according to claim 7, wherein said catalyst layer is deposited by evaporation.

9. The method according to claim 1, wherein:
    depositing the bottom layer includes depositing a continuous bottom layer;
    depositing the catalyst layer includes depositing a continuous catalyst layer on an upper surface the continuous bottom layer; and
    heating the stack of layers includes growing a plurality of nanostructures from the continuous catalyst layer.

10. A nanostructure device comprising:
    a substrate;
    a bottom layer arranged on an upper surface of the substrate, said bottom layer having a first crystallographic grain structure with a first average grain size;
    a catalyst layer arranged on an upper surface of the bottom layer said catalyst layer having a second crystallographic grain structure with a second average grain size larger than the first average grain size of the bottom layer, thereby forming a stack of layers; and
    a plurality of nanostructures arranged on said catalyst layer wherein each of said nanostructures comprises
    a base adjacent to said catalyst layer,
    a tip, and
    a body between said base and said tip,
    wherein the bottom layer and the catalyst layer are interdiffused at an interface between said bottom layer and said catalyst layer.

11. The nanostructure device according to claim 10, wherein the catalyst layer has a first material composition and the bottom layer has a second material composition that is different from said first material composition.

12. The nanostructure device according to claim 11, wherein the second material composition of the bottom layer has a higher melting point than the first material composition of the catalyst layer.

13. The nanostructure device according to claim 10, wherein said tip comprises material from said catalyst layer.

14. The nanostructure device according to claim 10, wherein said body of each of said nanostructure comprises carbon.

15. The nanostructure device according to claim 10, wherein:
    the bottom layer is continuous;
    the catalyst layer is arranged as a continuous layer on the upper surface of the bottom layer; and
    the plurality of nanostructures are arranged on said continuous layer.

* * * * *